United States Patent [19]
Chiozzi

[11] Patent Number: 6,020,623
[45] Date of Patent: Feb. 1, 2000

[54] INTEGRATED STRUCTURE WITH DEVICE HAVING A PRESET REVERSE CONDUCTION THRESHOLD

[75] Inventor: Giorgio Chiozzi, Milan, Italy

[73] Assignee: SGS-Thomson Microelectronics S.r.L, Agrate Brianza, Italy

[21] Appl. No.: 08/984,910

[22] Filed: Dec. 4, 1997

[51] Int. Cl.[7] ............... H01L 27/082; H01L 27/102; H01L 29/90; H01L 31/11
[52] U.S. Cl. .............. 257/575; 257/579; 257/162; 257/163
[58] Field of Search ................... 257/575, 579, 257/162, 163, 168

[56] References Cited

U.S. PATENT DOCUMENTS 3,626,390  12/1971  Chang et al. .
4,319,257   3/1982  Beasom .
4,766,469   8/1988  Hill .
4,936,928   6/1990  Shaw et al. .
5,747,837   5/1998  Iwase et al. .

OTHER PUBLICATIONS

Sedra et al, *Microelectronic Circuits*, pp. A–8 & A–9, 1987.

*Primary Examiner*—Stephen D. Meier
*Attorney, Agent, or Firm*—Allen, Dyer, Doppelt, Milbrath & Gilchrist, P.A.

[57] ABSTRACT

An integrated structure is made in a chip of semiconductor material inside an insulated N type region extending from a surface of the chip. The structure comprises a Zener diode formed by a P type first region extending from the surface inside the insulated region and by a second region of type N extending from the surface inside the first region. These regions form between themselves a buried junction, in which the structure further includes a lateral bipolar transistor having an emitter region provided by the first region.

17 Claims, 2 Drawing Sheets

INTEGRATED STRUCTURE WITH DEVICE HAVING A PRESET REVERSE CONDUCTION THRESHOLD

FIELD OF THE INVENTION

The present invention relates to semiconductor integrated device structures, and, more particularly, to such structures having a preset reverse conduction threshold.

BACKGROUND OF THE INVENTION

Devices with preset reverse conduction thresholds, such as Zener diodes, are used in many different applications as voltage limiters or references. They effect a limitation of the maximum voltage which can be applied between two nodes of a circuit or maintain a node at a preset voltage value with respect to a reference voltage. As is known in a Zener diode, when the reverse voltage applied between an anode terminal and a cathode terminal exceeds a specified threshold value Vz (Zener voltage), which typically can vary from a few volts to some tens or hundreds of volts, the diode goes into reverse conduction with a variable current and substantially constant voltage.

Zener diodes are generally made by exploiting the phenomenon of the nondestructive reverse breakdown of a PN junction. Commonly Zener diodes have a surface structure in which the PN junction is formed between a P type region and an adjacent N type region which extend from an upper surface of a semiconductor chip. Such Zener diodes have low series resistance and a voltage-current characteristic curve which exhibits a very sharp discontinuity at the threshold voltage. A drawback with Zener diodes of the surface type is that they exhibit drift phenomena in the long term which causes an increase in the series resistance and in the threshold voltage.

Zener diodes with buried structures are known, as illustrated in the partial sectional schematic view of FIG. 1. As is usual, the concentrations of the impurities of type N and P are indicated by adding the sign + or the sign − to the letters N and P to indicate a high or low concentration, respectively, of impurities. The letters N and P without the addition of + or − signs denote concentrations of intermediate value. The figure shows a device 100 having a preset reverse conduction threshold made inside an insulated region 105 of N type made in a semiconductor chip. A P type region 110 extends from an upper surface of the chip inside the insulated region 105. An N+ type region 115 extends from the same surface inside the region 110. A P+ type region 120 extends from the lower surface of the region 115 until it reaches, through the region 110, the insulated region 105. The P+ type region 120 defines with the N+ region 115 a buried PN junction. Conductive lines 125 and 130 in contact with surface areas of the regions, 110 and 115 respectively, form an anode electrode and cathode electrode, respectively, of the device 100.

The equivalent circuit of the device 100, as shown in the figure, comprises a Zener diode 135 formed by the buried PN junction described above, whose cathode terminal is connected to the electrode 130. A drawback of this structure is that the device 100 exhibits high series resistance due to the P type region 110, represented schematically by a resistor 140 connected between an anode terminal of the Zener diode 135 and the electrode 125.

Moreover, the P region 110 and the N+ region 115 form a further Zener diode 145 with the surface structure, the anode and cathode terminals of which are linked, respectively, to the electrodes 125 and 130. Using $V_b$ and $V_s$ to indicate the threshold voltages of the Zener diodes, 135 and 145 respectively, R the resistance of the resistor 140 and I the current which passes through the Zener diode 135 and the resistor 140, for the surface Zener diode 145 to be non-conducting it is necessary that the following condition be satisfied:

$$R \cdot I + V_b < V_s$$

i.e.

$$I < (V_s - V_b)/R$$

In the case in which the threshold voltages of the two Zener diodes 135 and 145 have a similar value, this current is extremely small and hence uncontrollable.

SUMMARY OF THE INVENTION

In view of the foregoing background, it is therefore an object of the present invention to provide an integrated device having a preset reverse conduction threshold exhibiting a low series resistance and having good reliability.

This and other objects, in accordance with the present invention are provided by an integrated device having a preset reverse conduction threshold and comprising a first region of a second conductivity type and a second region of the first conductivity type both extending from the first surface and being inside an insulated region of the semiconductor chip to form buried junction. In addition, the structure preferably includes a lateral bipolar transistor having an emitter region and a base region provided by, respectively, the first region and the insulated region. The lateral bipolar transistor also further includes a third region of second conductivity type extending from the first surface and being inside the insulated region to provide a collector region. An electrode may be provided in contact with the second region. In addition, a collector electrode and a base electrode may be provided on the first surface and in contact with the third region and the insulated region, respectively.

The integrated structure of the present invention exhibits low series resistance and good reliability because the breakdown phenomenon occurs at depth and surface breakdown phenomena are not manifested. Moreover, this structure has good temperature stability. The structure of the present invention can be made by the normal processes for producing bipolar integrated structures, without requiring additional phases or masking. Fabrication therefore uses standard processes and is economically advantageous.

BRIEF DESCRIPTION OF THE PREFERRED EMBODIMENTS

Further characteristics and advantages of the integrated structure according to the present invention will emerge from the following description of a preferred embodiment thereof, given by way of non-limiting illustration, with reference to the appended figures in which:

FIG. 1 is a partial sectional schematic view of a known prior art integrated device having a reverse conduction threshold; and FIG. 2 is a partial sectional schematic view of the integrated structure according to the present invention.

DETAILED DESCRIPTION OF THE PREFERRED EMBODIMENTS

Figure 1:
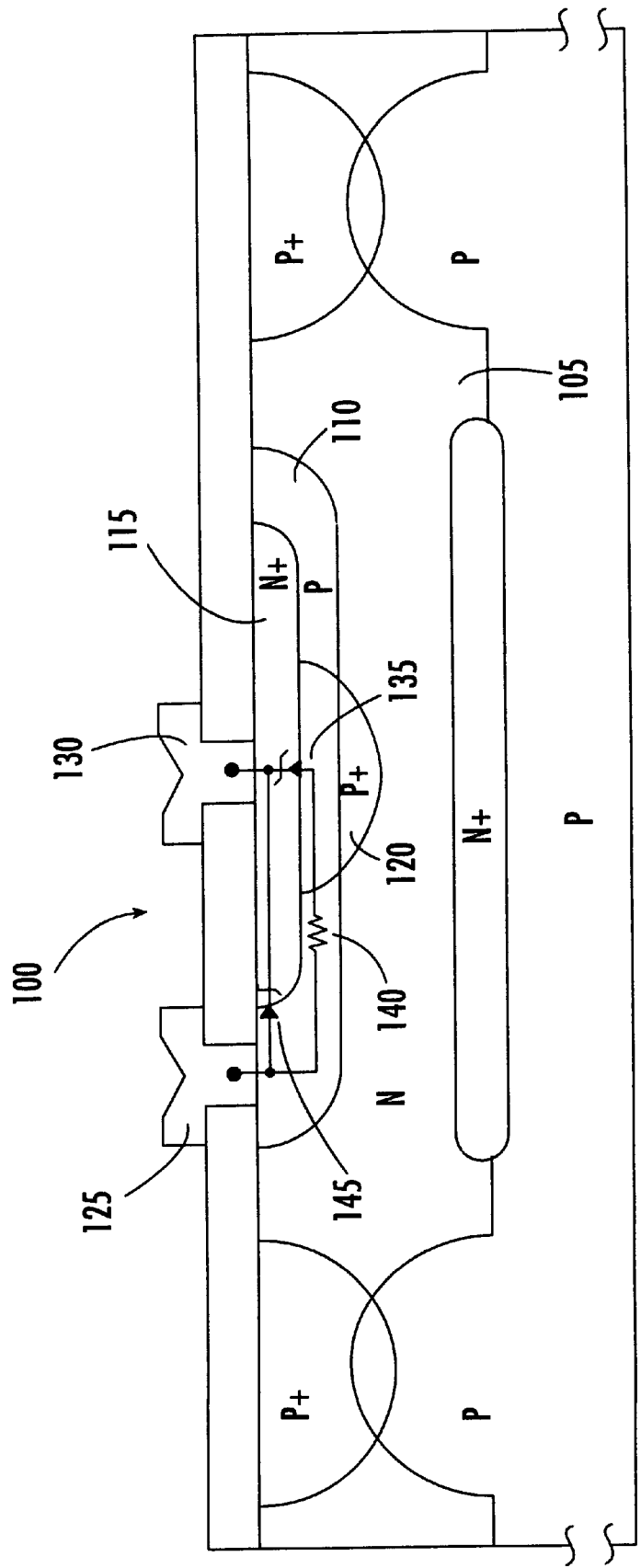
Figure 2:
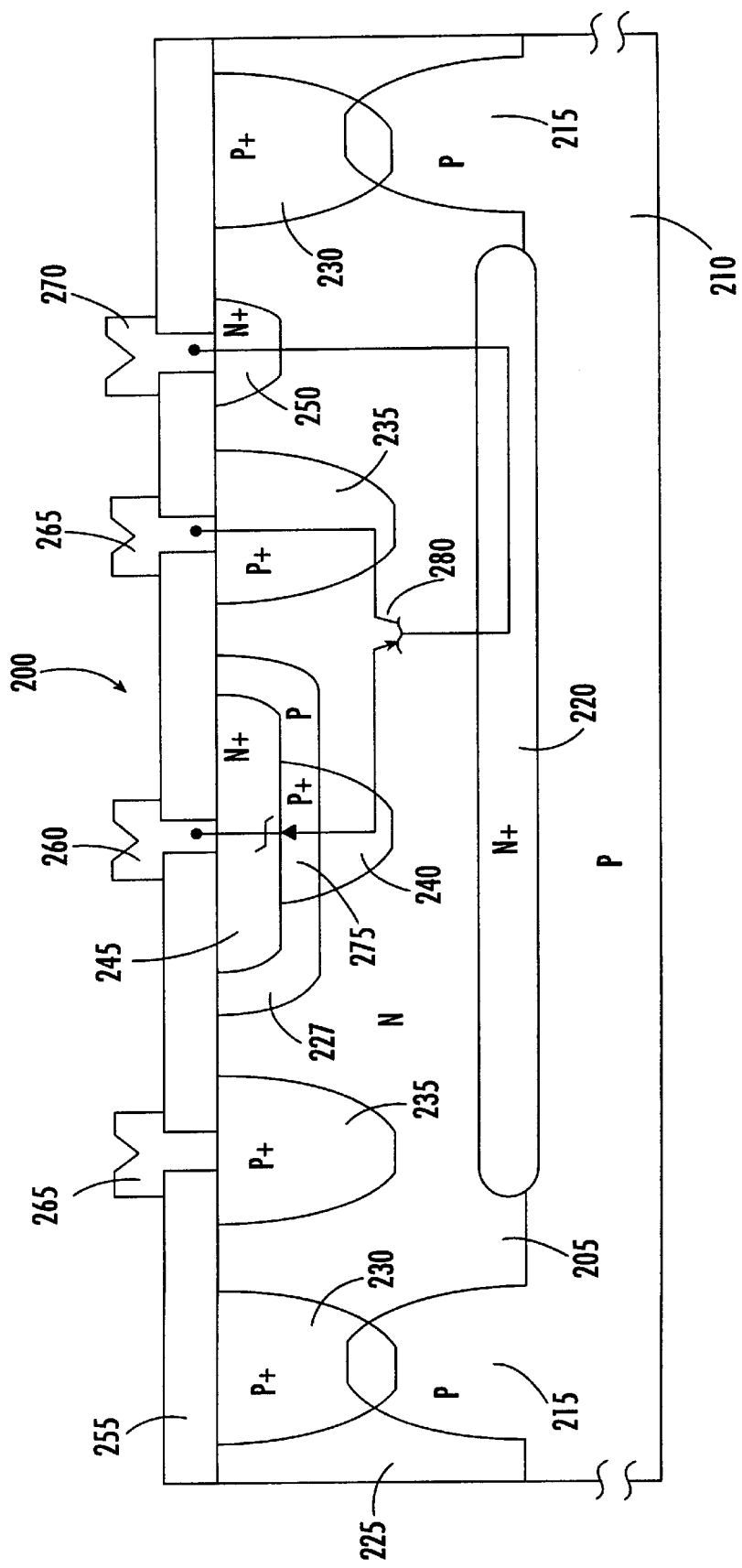

With reference now to the figures, and in particular with reference to FIG. 2 (FIG. 1 was described earlier) the integrated structure 200 in accordance with the present invention is made in a chip of semiconductor material, inside an insulated region 205 of type N made in the same chip. Dual considerations are, however, applicable if the N type regions are replaced by corresponding P type regions and vice versa.

In particular, the semiconductor chip comprises a substrate 210, typically monocrystalline silicon, doped with P type impurities. A P type region 215 which extends in plan view like a frame and, inside it, an N+ type region 220 are formed on the upper surface of the substrate 210 by ion implantation and subsequent diffusion. An epitaxial layer 225 of N type with low impurity concentration is formed on the upper surface of the substrate 210 by epitaxial growth. In this phase, which is undertaken at high temperature, the P type and N type impurities previously implanted diffuse further into the substrate 210 and into the epitaxial layer 225. In particular, the P type impurities define a lower part of an insulation region, while the N type impurities define a region 220 buried between the substrate 210 and the epitaxial layer 225.

A P type region 227 is then formed on the upper surface of the epitaxial layer 225 by known techniques of masking, implantation and subsequent diffusion. Subsequently, further regions having high P type impurity concentration are formed likewise. In particular, a P+ type region 230 (extending in plan view like a frame) joins up with the region 215 to complete the insulation region 215, 230 which delimits, together with the substrate 210, a portion of the epitaxial layer 225 which defines the insulated region 205.

Inside the insulated region 205 a P+ region 235 is made, typically extending in plan view like a circular frame around the region 227. A P+ type region 240 extends from the upper surface of the chip 200 through the region 227 until it reaches the insulated region 205. Typically, the P+ region 240 has a greater depth than that of the P region 227.

Similar techniques of implantation and diffusion are then used to form an N+ type region 245 which extends from the upper surface of the chip 200 inside the region 227, 240. These N type impurities neutralize the P type impurities in an upper internal portion of the region 227, 240. In this way, the N+ type region 245 becomes insulated from the epitaxial layer and defines with the P+ type region 240 a buried PN junction. An N+ type contact region 250 which extends inside the insulated region 205 is also formed on the upper surface of the chip.

Subsequently, conductive lines, made for example of metal or polycrystalline silicon, 260, 265 and 270 in contact with surface areas of the regions 245, 235 and 250, respectively, are formed on the upper surface of the chip. The upper surface, in turn, is coated with an insulating layer 255 (typically silicon dioxide). Known techniques of deposition, masking and etching are used.

The equivalent circuit of the integrated structure 200, as show in the figure, comprises a Zener diode 275 formed by the buried PN junction defined by the P+ region 240 (anode) and by the N+ region 245 (cathode), and a PNP lateral bipolar transistor 280 formed by the P+ type region 240 (emitter, in the reverse conduction phase of the Zener diode 275), by the N type region 205, 220, 250 (base) and by the P+ type region 235 (collector). The buried region 220 advantageously increases the doping of the base region, and, hence, reduces the gain of a PNP stray vertical transistor formed by the P+ region 240 (emitter, in the conduction phase of the transistor 280), by the N+ type region 205, 220 (base) and by the P type substrate 210 (collector). The N+ region 250 promotes good ohmic contact, avoiding the formation of a PN junction, between the N type insulated region 205 and the track or line 270 (generally made of aluminum) containing P type impurities.

The track or line 260, in surface contact with the region 245, forms a cathode electrode of the Zener diode 275. The anode terminal of the Zener diode 275 becomes connected to the emitter terminal of the PNP lateral transistor 280 (common region 240). The lines 265 and 270 form a collector electrode and base electrode, respectively, of the PNP lateral transistor.

The PNP lateral transistor 280 is used to contact the anode region 240 of the Zener diode 275. When the Zener diode 275 is in reverse conduction, the current which passes through it flows to the collector electrode 265 of the transistor 280, in forward conduction. This prevents the formation of surface breakdown phenomena and affords the structure 200 a low series resistance.

It should be noted, moreover, that the reverse threshold voltage of the Zener diode 275 varies with temperature on account of the thermal drifting of this component. In particular, the reverse threshold voltage increases with increasing temperature, so that the temperature coefficient of the Zener diode 275, i.e., the ratio between the variation in the reverse threshold voltage and the variation in the temperature, is positive. In the structure 200 of the present invention, the increase with temperature of the reverse threshold voltage of the Zener diode 275 is compensated, at least partially, by the PN junction, defined by the P+ region 235 and by the N insulated region 205, which is linked in series to the Zener diode 275. This is because during the conduction phase of the transistor 280, this junction becomes forward biased, and, therefore, exhibits a negative temperature coefficient so that its threshold voltage decreases with increasing temperature.

Under conditions of use, the collector electrode 265 is linked, for example, to a reference terminal (or ground), while the base electrode 270 is linked to a generator of voltage of specified value (with respect to ground). By linking the cathode electrode 260 to a current generator, when the Zener diode 275 goes into reverse conduction and the PNP transistor 280 goes into forward conduction, the voltage on the cathode electrode 260 becomes fixed at a value equal to the voltage on the electrode 270 plus the base-emitter threshold voltage (Vbe) of the PNP transistor 280 (for example 0.6 V) and the reverse threshold voltage of the Zener diode 275. It should be noted that this structure advantageously possesses a reference input, in the form of the base electrode 270, having high impedance, and this makes it possible, for example, to use a voltage generator with high output impedance. Alternatively, the base electrode 270 is linked to the collector electrode 265, so that, when the Zener diode 275 is in reverse conduction, the PNP transistor 280 is in forward conduction and a voltage of constant value equal to the sum of the reverse threshold voltage of the Zener diode 275 and of the base-emitter threshold voltage of the PNP transistor 280 is maintained between the anode electrode 260 and the electrodes 265, 270.

Obviously a person skilled in the art will be able, for the purpose of satisfying contingent and specific requirements, to introduce numerous modifications and variations to the integrated structure described above, all nevertheless contained within the scope of protection of the invention, as defined by the following claims.

That which is claimed is:

1. An integrated structure made in a chip of semiconductor material and comprising:
   an insulated region of a first conductivity type within the chip of semiconductor material and extending from a first surface thereof;
   a device having a preset reverse conduction threshold comprising a first region of a second conductivity type and a second region of the first conductivity type both extending from the first surface and being inside the insulated region to form a buried junction;
   an electrode on the first surface and being in contact with the second region;
   a lateral bipolar transistor having an emitter region and a base region provided by, respectively, the first region and the insulated region, the lateral bipolar transistor further comprising a third region of second conductivity type extending from the first surface and being inside the insulated region and lateral to the emitter region to provide a collector region; and
   a collector electrode and a base electrode on the first surface and in contact with the third region and the insulated region, respectively.

2. A structure according to claim 1, wherein said first region comprises first and second portions; and wherein the second portion extends from the buried junction into the insulated region and has a greater impurity concentration than an impurity concentration of the first portion.

3. A structure according to claim 2, wherein the first and second portions extend within the insulated region to a first and to a second depth, respectively, with respect to the first surface; and wherein the second depth is greater than the first depth.

4. A structure according to claim 1, further comprising a contact region of the first conductivity type extending from the first surface inside the insulated region and having a greater impurity concentration that an impurity concentration of the insulated region; and wherein said base electrode is in contact on the first surface with the contact region.

5. A structure according to claim 1, wherein the chip of semiconductor material has a second surface opposite the first surface and comprises a substrate of the second conductivity type and an epitaxial layer of the first conductivity type extending between the second surface and the first surface; and wherein the insulated region is formed by a portion of the epitaxial layer which is delimited by the substrate and by an insulation region of the second conductivity type extending from the first surface to the substrate.

6. A structure according to claim 5, further comprising a buried region of the first conductivity type having a greater impurity concentration than an impurity concentration of the insulated region; and wherein the buried region is buried between the substrate and the epitaxial layer.

7. A structure according to claim 1, wherein the third region extends in plan view like a frame around the first region.

8. A structure according to claim 1, wherein the first conductivity type is N and the second conductivity type is P.

9. An integrated circuit comprising:
   a chip of semiconductor material comprising an insulated region of a first conductivity type therein and extending from a first surface thereof;
   a device having a preset reverse conduction threshold comprising a first region of a second conductivity type and a second region of the first conductivity type both extending from the first surface and being inside the insulated region to form a buried junction; and
   a lateral bipolar transistor having an emitter region and a base region provided by, respectively, the first region and the insulated region, the lateral bipolar transistor further comprising a third region of second conductivity type extending from the first surface and being inside the insulated region and lateral to the emitter region to provide a collector region.

10. An integrated circuit according to claim 9, further comprising:
    an electrode on the first surface and being in contact with the second region; and
    a collector electrode and a base electrode on the first surface and in contact with the third region and the insulated region, respectively.

11. An integrated circuit according to claim 9, wherein said first region comprises first and second portions; and wherein the second portion extends from the buried junction into the insulated region and has a greater impurity concentration than an impurity concentration of the first portion.

12. An integrated circuit according to claim 11, wherein the first and second portions extend within the insulated region to a first and to a second depth, respectively, with respect to the first surface; and wherein the second depth is greater than the first depth.

13. An integrated circuit according to claim 10, further comprising a contact region of the first conductivity type extending from the first surface inside the insulated region and having a greater impurity concentration that an impurity concentration of the insulated region; and wherein said base electrode is in contact on the first surface with the contact region.

14. An integrated circuit according to claim 9, wherein the chip of semiconductor material has a second surface opposite the first surface and comprises a substrate of the second conductivity type and an epitaxial layer of the first conductivity type extending between the second surface and the first surface; and wherein the insulated region is formed by a portion of the epitaxial layer which is delimited by the substrate and by an insulation region of the second conductivity type extending from the first surface to the substrate.

15. An integrated circuit according to claim 14, further comprising a buried region of the first conductivity type having a greater impurity concentration than an impurity concentration of the insulated region; and wherein the buried region is buried between the substrate and the epitaxial layer.

16. An integrated circuit according to claim 9, wherein the third region extends in plan view like a frame around the first region.

17. An integrated circuit according to claim 9, wherein the first conductivity type is N and the second conductivity type is P.

* * * * *

UNITED STATES PATENT AND TRADEMARK OFFICE
CERTIFICATE OF CORRECTION

PATENT NO. : 6,020,623
DATED : February 1, 2000
INVENTOR(S) : Chiozzi

It is certified that error appears in the above-identified patent and that said Letters Patent is hereby corrected as shown below:

Title page insert item --[30] Foreign Application Priority Data

December 23, 1996   [IT]   Italy .............. MI 96A 002728 --

Signed and Sealed this

Thirtieth Day of January, 2001

Attest:

Q. TODD DICKINSON

Attesting Officer           Director of Patents and Trademarks